(12) United States Patent
Asaba et al.

(10) Patent No.: US 10,084,046 B1
(45) Date of Patent: Sep. 25, 2018

(54) SEMICONDUCTOR DEVICE, INVERTER CIRCUIT, DRIVE DEVICE, VEHICLE, AND ELEVATING MACHINE

(71) Applicant: Kabushiki Kaisha Toshiba, Minato-ku (JP)

(72) Inventors: Shunsuke Asaba, Kawasaki (JP); Teruyuki Ohashi, Himeji (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/694,381

(22) Filed: Sep. 1, 2017

(30) Foreign Application Priority Data

Mar. 21, 2017 (JP) .................................. 2017-055008

(51) Int. Cl.
| | |
|---|---|
| *H01L 29/15* | (2006.01) |
| *H01L 31/0328* | (2006.01) |
| *H01L 21/8238* | (2006.01) |
| *H01L 21/336* | (2006.01) |
| *H01L 29/16* | (2006.01) |
| *H01L 29/78* | (2006.01) |
| *H01L 29/10* | (2006.01) |
| *H01L 29/06* | (2006.01) |

(Continued)

(52) U.S. Cl.
CPC ...... *H01L 29/1608* (2013.01); *H01L 29/0611* (2013.01); *H01L 29/1095* (2013.01); *H01L 29/7802* (2013.01); *B60L 2210/42* (2013.01); *B61C 3/00* (2013.01); *B66B 11/043* (2013.01); *H01L 29/7395* (2013.01); *H02M 7/537* (2013.01); *H02P 27/06* (2013.01)

(58) Field of Classification Search
CPC ............. H01L 29/1608; H01L 29/0611; H01L 29/1095; H01L 29/7802; H01L 29/7395; H01L 29/7788; H01L 29/7801; H01L 29/66666; H01L 21/02529; H01L 21/045; H01L 21/049; H01L 21/02378

See application file for complete search history.

(56) References Cited

U.S. PATENT DOCUMENTS 8,507,922 B2    8/2013  Kawamoto et al.
9,748,343 B2 *  8/2017  Shimizu .............. H01L 29/1608

FOREIGN PATENT DOCUMENTS

| JP | 1-228154 | 9/1989 |
| JP | 2002-100773 | 4/2002 |
| JP | 4956649 | 6/2012 |

* cited by examiner

*Primary Examiner* — Hsien Ming Lee
(74) *Attorney, Agent, or Firm* — Oblon, McClelland, Maier & Neustadt, L.L.P.

(57) ABSTRACT

A semiconductor device of an embodiment includes first and second electrodes, a first gate electrode, a semiconductor layer disposed between the first electrode and a band gap of the semiconductor layer being wider than a band gap of silicon, a silicon layer between the semiconductor layer and the first electrode, a metal layer between the semiconductor layer and the silicon layer, a first semiconductor region of a first-conductivity type in the semiconductor layer, a first silicon region of the first-conductivity type in the silicon layer, a second silicon region of a second-conductivity type in the first silicon region, a third silicon region of the second-conductivity type in the first silicon region and separated from the second silicon region, a first gate insulating layer, a fourth silicon region of the first-conductivity type in the second silicon region, and a fifth silicon region in the third silicon region.

20 Claims, 11 Drawing Sheets

(51) Int. Cl.
*H01L 29/739* (2006.01)
*H02M 7/537* (2006.01)
*H02P 27/06* (2006.01)
*B66B 11/04* (2006.01)
*B61C 3/00* (2006.01)

SEMICONDUCTOR DEVICE, INVERTER CIRCUIT, DRIVE DEVICE, VEHICLE, AND ELEVATING MACHINE

CROSS-REFERENCE TO RELATED APPLICATION

This application is based upon and claims the benefit of priority from Japanese Patent Application No. 2017-055008, filed on Mar. 21, 2017, the entire contents of which are incorporated herein by reference.

FIELD

Embodiments described herein relate generally to a semiconductor device, an inverter circuit, a drive device, a vehicle, and an elevating machine.

BACKGROUND

Silicon carbide, for example, is expected to be a material for next generation semiconductor devices. Silicon carbide has superior physical properties such as a band gap of three times wider, a breakdown field strength of about ten times higher, and a thermal conductivity of about three times higher than those of silicon. Utilizing such physical properties, it is possible to provide metal oxide semiconductor field effect transistors (MOSFETs), insulated gate bipolar transistors (IGBTs) and the like with a high breakdown voltage, low loss characteristics, and high-temperature operation capability.

However, for example, in the case of forming a MOSFET with silicon carbide, the mobility of the channel is lowered and the channel resistance is increased as compared with the case of silicon. This may cause an increase in the on-resistance of the MOSFET.

DETAILED DESCRIPTION

Figure 1:
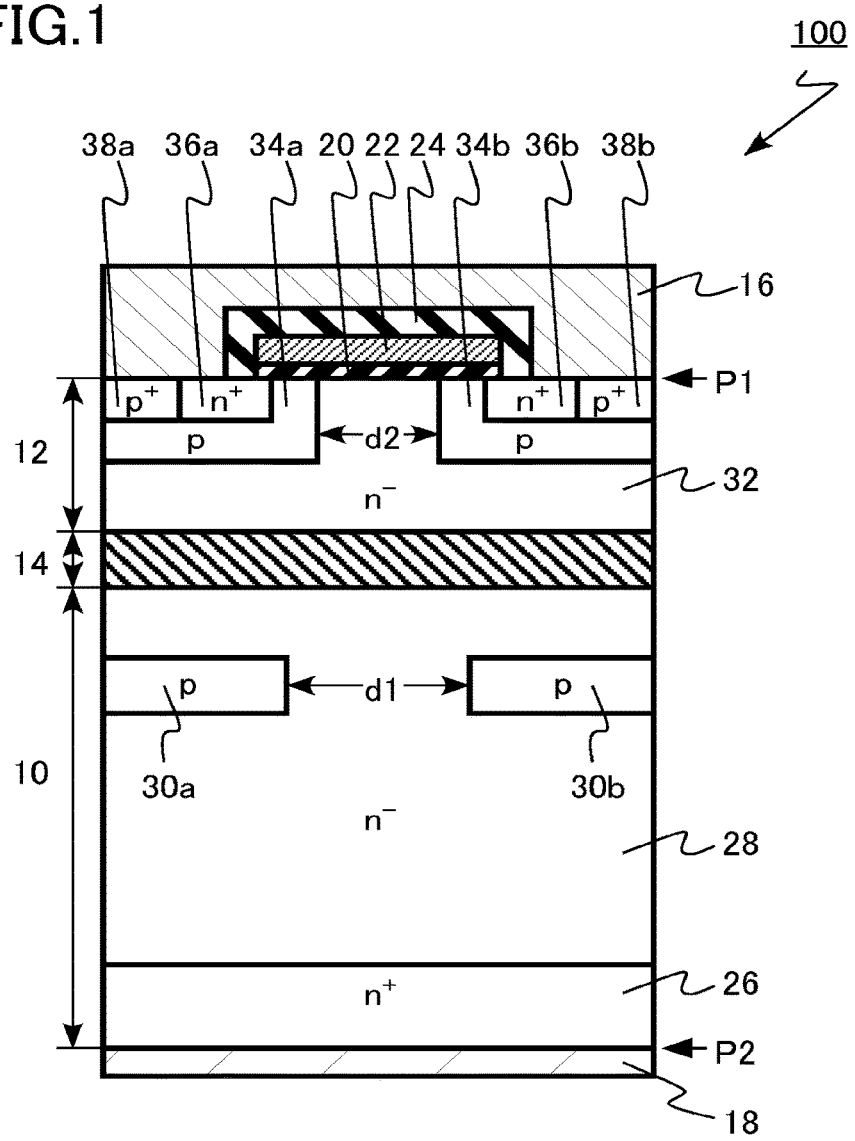
FIG. 1 is a schematic sectional view of a semiconductor device of a first embodiment.

A semiconductor device of an embodiment includes a first electrode, a second electrode; a first gate electrode; a semiconductor layer disposed between the first electrode and the second electrode, a band gap of the semiconductor layer being wider than a band gap of silicon; a silicon layer disposed between the semiconductor layer and the first electrode; a metal layer disposed between the semiconductor layer and the silicon layer; a first semiconductor region of a first-conductivity type disposed in the semiconductor layer; a first silicon region of the first-conductivity type disposed in the silicon layer; a second silicon region of a second-conductivity type disposed in the silicon layer, the second silicon region disposed between the first silicon region and the first electrode; a third silicon region of the second-conductivity type disposed in the silicon layer, the third silicon region disposed between the first silicon region and the first electrode, the first silicon region being disposed between the second silicon region and the third silicon region; a first gate insulating layer disposed between the first gate electrode and the second silicon region, the first gate insulating layer disposed between the first gate electrode and the third silicon region; a fourth silicon region of the first-conductivity type disposed in the silicon layer, the fourth silicon region disposed between the second silicon region and the first electrode; and a fifth silicon region of the first-conductivity type disposed in the silicon layer, the fifth silicon region disposed between the third silicon region and the first electrode.

Hereinafter, embodiments of the present disclosure will be described with reference to the drawings. In the following description, the same or similar members and the like are denoted by the same reference numerals, and the explanation of the members and the like once described are omitted as appropriate.

In the following description, the notations, $n^+$, n, $n^-$, $p^+$, p, and $p^-$, represent a relative degree of impurity concentration of each conductivity type. Specifically, $n^+$ indicates that the n-type impurity concentration is relatively higher than n, and $n^-$ indicates that the n-type impurity concentration is relatively lower than n. $P^+$ indicates that the p-type impurity concentration is relatively higher than p, and $p^-$ indicates that the p-type impurity concentration is relatively lower than p. Note that $n^-$-type and $n^-$-type may be simply described as n-type, and $p^+$-type and $p^-$-type simply as p-type.

The impurity concentration can be measured using secondary ion mass spectrometry (SIMS), for example. The relative degree of the impurity concentration can also be determined from the degree of the carrier concentration obtained by, for example, scanning capacitance microscopy (SCM). The distance such as the depth and the thickness of an impurity region can be obtained using SIMS, for example. Further, the distances such as the depths, the thicknesses, the widths, and the interval of the impurity regions can be obtained from a combined image of an SCM image and an atomic force microscope (AFM) image, for example.

First Embodiment

A semiconductor device of this embodiment includes: a first electrode; a second electrode; a first gate electrode; a semiconductor layer disposed between the first electrode and the second electrode and having a wider band gap than a band gap of silicon; a silicon layer disposed between the semiconductor layer and the first electrode; a metal layer disposed between the semiconductor layer and the silicon layer; a first semiconductor region of a first-conductivity type disposed in the semiconductor layer; a first silicon region of the first-conductivity type disposed in the silicon layer; a second silicon region of a second-conductivity type disposed in the silicon layer and between the first silicon region and the first electrode; a third silicon region of the second-conductivity type disposed in the silicon layer and disposed between the first silicon region and the first electrode, the first silicon region being disposed between the second silicon region and the third silicon region; a first gate insulating layer disposed between the first gate electrode and the second silicon region and between the first gate electrode and the third silicon region; a fourth silicon region of the first-conductivity type disposed in the silicon layer and between the second silicon region and the first electrode; and a fifth silicon region of the first-conductivity type disposed in the silicon layer and between the third silicon region and the first electrode.

Figure 2:
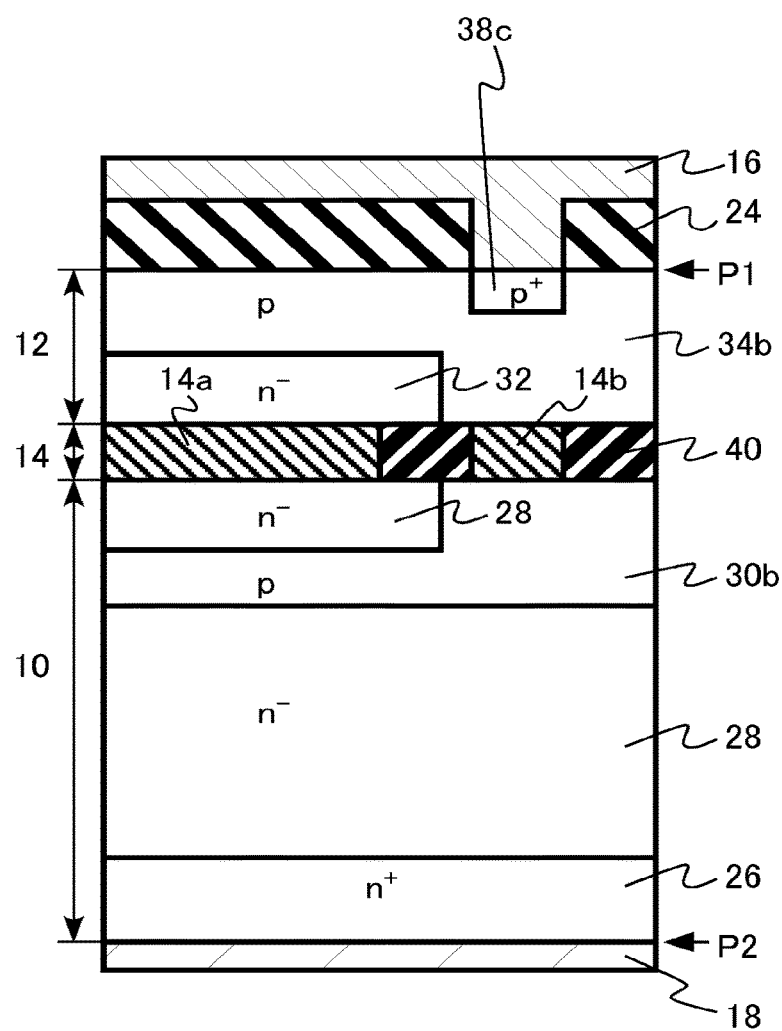
FIG. 2 is a schematic sectional view of the semiconductor device of the first embodiment.

FIGS. 1 and 2 are schematic sectional views of a semiconductor device of this embodiment. The semiconductor device of this embodiment is a planar gate type vertical MOSFET 100 in which a silicon carbide layer and a silicon layer are joined together with a metal layer. FIG. 1 is a sectional view of a main part of the vertical MOSFET 100. FIG. 2 is a sectional view of a contact portion to a field-relaxation region.

Hereinafter, an example in which the first-conductivity type is n-type and the second-conductivity type is p-type will be described. The MOSFET 100 is a vertical n-channel MOSFET the carriers of which are electrons.

The MOSFET 100 includes a silicon carbide layer 10 (a semiconductor layer), a silicon layer 12, a metal layer 14, a source electrode 16 (first electrode), a drain electrode 18 (second electrode), a first gate insulating layer 20, a first gate electrode 22, and an interlayer insulating layer 24.

The silicon carbide layer 10 includes an n$^+$-type drain region 26 (fifth semiconductor region), an n$^-$-type drift region (first semiconductor region), a p-type first field-relaxation region 30a (second semiconductor region), and a p-type second field-relaxation region 30b (third semiconductor region). The silicon layer 12 includes an n$^-$-type substrate region 32 (first silicon region), a p-type first well region 34a (second silicon region), a p-type second well region 34b (third silicon region), an n$^+$-type first source region 36a (fourth silicon region), an n$^+$-type second source region 36b (fifth silicon region), a p$^+$-type first well contact region 38a (seventh silicon region), and a p$^+$-type second well contact region 38b (eighth silicon region).

At least a part of the silicon carbide layer 10 is provided between the source electrode 16 and the drain electrode 18. At least apart of the silicon carbide layer 10 is provided between the first gate electrode 22 and the drain electrode 18. The silicon carbide layer 10 has a wider band gap than that of silicon. The silicon carbide layer 10 is a single crystal silicon carbide (SiC). The silicon carbide layer 10 is, for example, 4H-SiC. The thickness in the depth direction of the silicon carbide layer 10 is, for example, 5 µm or more and 150 µm or less.

The surface where the silicon carbide layer 10 is in contact with the drain electrode 18 is referred to as a second surface ("P2" in FIG. 1). The second surface P2 is also referred to as a back surface. The second surface P2 is, for example, a surface inclined at an angle of 0° or more and 8° or less with respect to a (000-1) plane. The (000-1) plane is referred to as a carbon face.

At least a part of the silicon layer 12 is provided between the source electrode 16 and the drain electrode 18. At least a part of the silicon layer 12 is provided between the first gate electrode 22 and the drain electrode 18. The silicon layer 12 is a single crystal silicon (Si). The thickness in the depth direction of the silicon layer 12 is 0.5 µm or more and 2 µm or less.

The surface where the silicon layer 12 is in contact with the source electrode 16 is referred to as a first surface ("P1" in FIG. 1). The first surface P1 is also referred to as a front surface. Hereinafter, the "depth" means the depth from the first surface. The first surface P1 is, for example, a surface inclined at an angle of 0° or more and 8° or less with respect to a (001) surface.

The metal layer 14 is disposed between the silicon carbide layer 10 and the silicon layer 12. The silicon carbide layer 10 and the silicon layer 12 are joined together by the metal layer 14.

The metal layer 14 is an alloy containing tin (Sn), for example. The metal layer 14 is an alloy containing tin (Sn), silver (Ag), and copper (Cu), for example. The metal layer 14 is, for example, solder. The melting point of the metal layer 14 is, for example, 300° C. or lower.

The thickness in the depth direction of the metal layer 14 is, for example, 0.2 µm or more and 0.5 µm or less. For example, the metal layer 14 is not fixed to a specific potential and is in a floating state.

The n$^+$-type drain region 26 is provided on the back surface of the silicon carbide layer 10. The drain region 26 contains, for example, nitrogen (N) as n-type impurities. The concentration of the n-type impurities in the drain region 26 is, for example, $1 \times 10^{18}$ cm$^{-3}$ or more and $1 \times 10^{21}$ cm$^{-3}$ or less. The n$^-$-type drift region 28 is provided on the drain region 26. The drift region 28 contains, for example, nitrogen (N) as n-type impurities. The concentration of the n-type impurities in the drift region 28 is lower than the concentration of the n-type impurities in the drain region 26. The concentration of the n-type impurities in the drift region 28 is, for example, $4 \times 10^{14}$ cm$^{-3}$ or more and $1 \times 10^{17}$ cm$^{-3}$ or less.

The p-type first field-relaxation region 30a is disposed between the drain electrode 18 and the p-type first well region 34a. The p-type second field-relaxation region 30b is disposed between the drain electrode 18 and the p-type second well region 34b.

The distance between the p-type first field-relaxation region 30a and the second surface P2 is substantially the same as the distance between the p-type second field-relaxation region 30b and the second surface P2. Apart of the drift region 28 is disposed between the first field-relaxation region 30a and the second field-relaxation region 30b. The first field-relaxation region 30a and the second field-relaxation region 30b are separated from each other. The distance between the first field-relaxation region 30a and the second field-relaxation region 30b is d1 (see FIG. 1).

The first field-relaxation region 30a and the second field-relaxation region 30b relaxes an electric field applied to the silicon carbide layer 10 and the silicon layer 12 when the MOSFET 100 is in an OFF state to enhance the breakdown voltage of the MOSFET 100.

The first field-relaxation region 30a and the second field-relaxation region 30b are electrically connected to, for example, the source electrode 16. The first field-relaxation region 30a and the second field-relaxation region 30b have the same potential as, for example, that of the source electrode 16.

The drift region 28 is disposed between the first and the second field-relaxation regions 30a, 30b and the metal layer 14. The first field-relaxation region 30a and the second field-relaxation region 30b are separated from the metal layer 14.

The thickness in the depth direction of each of the first field-relaxation region 30a and the second field-relaxation region 30b is, for example, 0.2 μm or more and 1.0 μm or less. The first field-relaxation region 30a and the second field-relaxation region 30b contain, for example, aluminum (Al) as p-type impurities. The concentration of the p-type impurities in each of the first field-relaxation region 30a and the second field-relaxation region 30b is, for example, $1\times10^{16}$ cm$^{-3}$ or more and $1\times10^{18}$ cm$^{-3}$ or less.

FIG. 2 is a sectional view showing an example of a contact portion to a field-relaxation region. As shown in FIG. 2, a region where the second field-relaxation region 30b is in contact with the metal layer 14b is provided in a part of the silicon carbide layer 10. A region where the second well region 34b is in contact with the metal layer 14b is provided in a part of the silicon layer 12. The metal layer 14b is electrically separated from the metal layer 14a, which is a current path of the MOSFET 100, by the insulating layer 40. The source electrode 16 is in contact with a p well contact region 38c. For example, the structure shown in FIG. 2 makes it possible to set the first field-relaxation region 30a and the second field-relaxation region 30b at the same potential as that of the source electrode 16.

The n$^-$-type substrate region 32 contains, for example, phosphorus (P) as n-type impurities. The concentration of the n-type impurities in the substrate region 32 is $4\times10^{14}$ cm$^{-3}$ or more and $1\times10^{17}$ cm$^{-3}$ or less.

The p-type first well region 34a is disposed between the substrate region 32 and the source electrode 16. The p-type second well region 34b is disposed between the substrate region 32 and the source electrode 16. Apart of the substrate region 32 is disposed between the first well region 34a and the second well region 34b.

The first well region 34a and the second well region 34b are separated from each other. The distance between the first well region 34a and the second well region 34b is d2 (see FIG. 1). The first well region 34a and the second well region 34b are separated from the metal layer 14.

Each of the first well region 34a and the second well region 34b contains, for example, boron (B) asp-type impurities. The peak value of the concentration of the p-type impurities in each of the first well region 34a and the second well region 34b is, for example, $1\times10^{17}$ cm$^{-3}$ or more and $1\times10^{19}$ cm$^{-3}$ or less.

The depth of each of the first well region 34a and the second well region 34b is, for example, 0.3 μm or more and 0.8 μm or less.

The vicinity of the region where each of the first well region 34a and the second well region 34b is in contact with the first gate insulating layer 20 serves as a channel region of the MOSFET 100.

The n$^+$-type first source region 36a is disposed between the first well region 34a and the source electrode 16. The first source region 36a is separated from the substrate region 32.

The n$^+$-type second source region 36b is disposed between the second well region 34b and the source electrode 16. The second source region 36b is separated from the substrate region 32.

Each of the first source region 36a and the second source region 36b contains, for example, phosphorus (P) or arsenic (As) as n-type impurities. The concentration of the n-type impurities in each of the first source region 36a and the second source region 36b is higher than the concentration of the n-type impurities in the substrate region 32.

The concentration of the n-type impurities in each of the first source region 36a and the second source region 36b is, for example, $1\times10^{19}$ cm$^{-3}$ or more and $1\times10^{21}$ cm$^{-3}$ or less. The depth of the first source region 36a and the second source region 36b is shallower than the depth of the first well region 34a and the second well region 34b, and is for example, 0.1 μm or more and 0.3 μm or less.

The first source region 36a and the second source region 36b are fixed at the potential of the source electrode 16.

The p$^+$-type first well contact region 38a is provided between the first well region 34a and the source electrode 16. The concentration of the p-type impurities in the first well contact region 38a is higher than the concentration of the p-type impurities in the first well region 34a.

The p$^+$-type second well contact region 38b is provided between the second well region 34b and the source electrode 16. The concentration of the p-type impurities in the second well contact region 38b is higher than the concentration of the p-type impurities in the second well region 34b.

Each of the first well contact region 38a and the second well contact region 38b contains, for example, boron (B) as p-type impurities. The concentration of the p-type impurities in the first well contact region 38a and the second well contact region 38b is, for example, $1\times10^{19}$ cm$^{-3}$ or more and $1\times10^{21}$ cm$^{-3}$.

The depth of each of the first well contact region 38a and the second well contact region 38b is, for example, 0.2 μm or more and 0.6 μm or less.

The first well contact region 38a and the second well contact region 38b are fixed at the potential of the source electrode 16.

The first gate electrode 22 is a conductive layer. The first gate electrode 22 is formed of, for example, polycrystalline silicon containing p-type impurities or n-type impurities.

The first gate insulating layer 20 is provided between the first gate electrode 22 and the first well region 34a. The first gate insulating layer 20 is also provided between the first gate electrode 22 and the second well region 34b. The first gate insulating layer 20 is also provided between the first gate electrode 22 and the drift region 28.

The first gate insulating layer 20 is formed of, for example, silicon oxide. For example, a high-k insulating material (high dielectric constant insulating material) is applicable to the first gate insulating layer 20.

The interlayer insulating layer 24 is provided on the first gate electrode 22. The interlayer insulating layer 24 is formed of, for example, silicon oxide.

The source electrode 16 is in contact with the first source region 36a and the second source region 36b. The source electrode 16 is in contact with the first well contact region 38a and the second well contact region 38b.

The source electrode 16 contains metal. The metal that forms the source electrode 16 has a stacked structure of, for example, titanium (Ti) and aluminum (Al). A region of the source electrode 16 that is in contact with the silicon layer 12 is formed of, for example, metal silicide. The metal silicide is, for example, titanium silicide or nickel silicide.

The drain electrode 18 is provided on the back surface of the silicon carbide layer 10. The drain electrode 18 is in contact with the drain region 26.

The drain electrode 18 is, for example, a metal or a metal semiconductor compound. The drain electrode 18 includes a material selected from the group consisting of, for example, nickel silicide, titanium (Ti), nickel (Ni), silver (Ag), and gold (Au).

Figure 3:
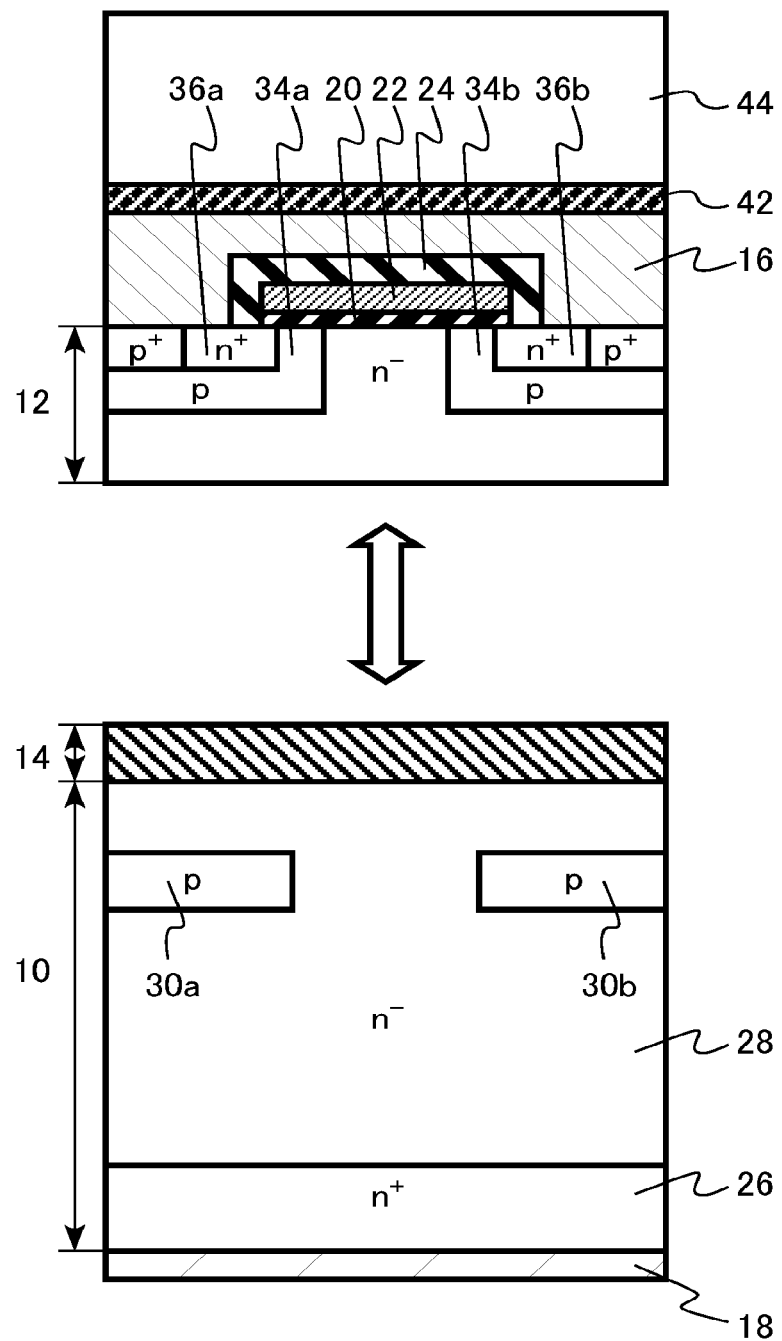
FIG. 3 is an explanatory diagram of a method of manufacturing the semiconductor device of the first embodiment.

FIG. 3 is an explanatory diagram of a method of manufacturing the semiconductor device of this embodiment. For example, impurity regions such as the first well region 34a, the second well region 34b, the first source region 36a, and the second source region 36b are formed in a single crystal silicon substrate by ion implantation. Further, the first gate insulating layer 20, the gate electrode 22, the interlayer insulating layer 24, and the source electrode 16 are formed by a known method.

Next, for example, the support substrate 44 and the silicon substrate are adhered using the adhesive layer 42. The silicon substrate is then thinned by polishing or the like to form the silicon layer 12. The support substrate 44 is, for example, quartz glass. The adhesive layer 42 is, for example, an adhesive containing a resin.

On the other hand, for example, the drift region 28 is formed by epitaxial growth on the silicon carbide substrate which acts as the drain region 26. Next, the first field-relaxation region 30a and the second field-relaxation region 30b are formed by ion implantation and heat treatment for activation of the implanted ions. The silicon carbide layer 10 including the first field-relaxation region 30a and the second field-relaxation region 30b is formed. After that, the drain electrode 18 is formed.

Next, solder, which is an example of the metal layer 14, is formed on the front surface of the silicon carbide layer 10 by vacuum evaporation. Next, the silicon layer 12 and the silicon carbide layer 10 are joined together via the solder. Next, the support substrate 44 is removed.

The MOSFET 100 shown in FIG. 1 is obtained by the above processes. It is also possible, for example, to form a metal wiring layer, a pad electrode and the like on the interlayer insulating layer 24 after the silicon layer 12 and the silicon carbide layer 10 are joined together via solder.

The function and effects of the MOSFET 100 of this embodiment will be described below.

According to the MOSFET 100 of this embodiment, the silicon carbide layer 10 and the silicon layer 12 are joined by the metal layer 14 to form a channel region of the MOSFET 100 in the silicon layer 12, thereby achieving a MOSFET with a high breakdown voltage and a low on-resistance. The details will be described below.

Silicon carbide has a breakdown field strength of about 10 times higher than that of silicon, and thus enables achieving a device with a higher breakdown voltage than a device formed of silicon. However, when a MOSFET is formed of silicon carbide for example, the mobility of the channel is lowered as compared with the case of silicon. This results in an increase in the channel resistance, which may cause an increase in the on-resistance of the MOSFET. There is a high possibility of an increase in the on-resistance particularly in a product with a drain-source breakdown voltage of about 1.2 kV at which the ratio of the channel resistance to the on-resistance increases.

In the MOSFET 100 of this embodiment, the drift region 28 is formed in the silicon carbide layer 10 having high electric field breakdown strength, thereby maintaining a high breakdown voltage. On the other hand, the first well region 34a and the second well region 34b where the channel regions are formed are formed in the silicon layer 12. Since the mobility of the electrons in silicon is larger than that of silicon carbide, a channel resistance is reduced. Therefore, a MOSFET with a high breakdown voltage and low on-resistance is obtained.

In the MOSFET 100, the silicon carbide layer 10 includes the p-type first field-relaxation region 30a and the p-type second field-relaxation region 30b. When the MOSFET 100 is in an OFF state, the electric field concentrates at the junction between the drift region 28 and the first and the second field-relaxation regions 30a, 30b. This makes it possible to easily reduce the maximum electric field in the silicon layer 12 with a low electric field breakdown strength.

Figure 4:
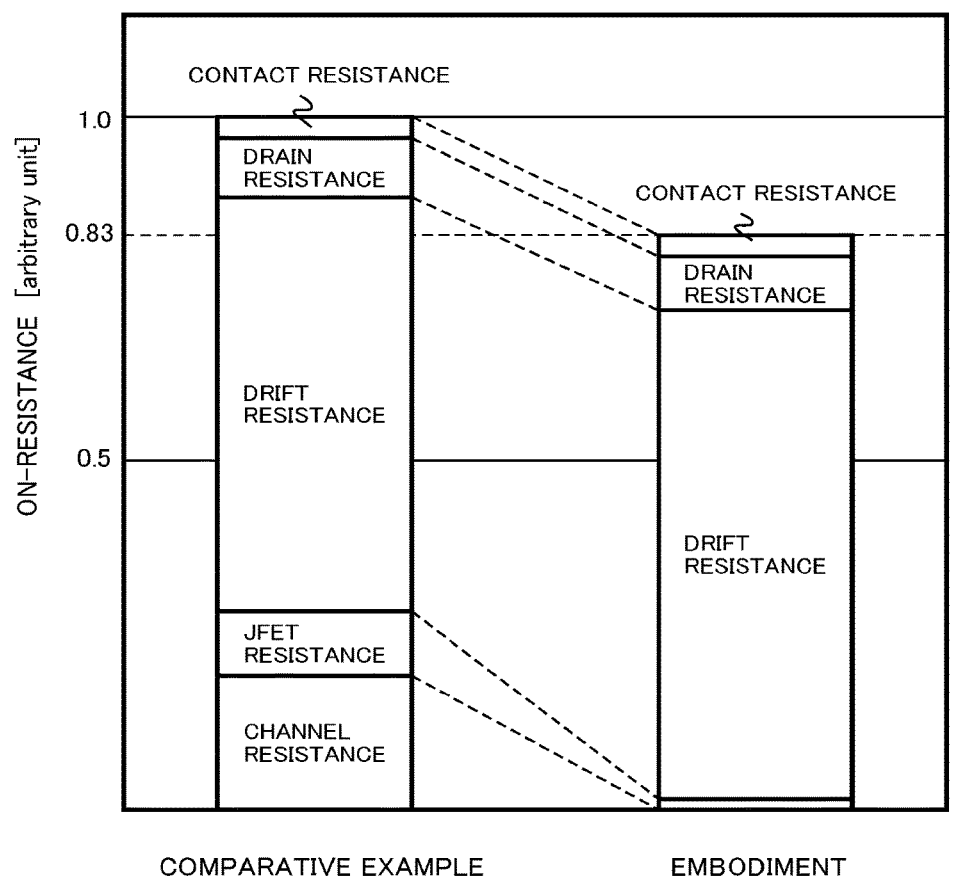
FIG. 4 is an explanatory diagram of the function and effect of the semiconductor device of the first embodiment.

FIG. 4 is an explanatory diagram of the function and effect of the semiconductor device of this embodiment. FIG. 4 is a diagram showing a simulation result of the on-resistance of the MOSFET. In the diagram, the embodiment indicates a calculation result of the MOSFET 100 with the structure shown in FIG. 1 and the comparative example indicates a calculation result of the MOSFET formed of only silicon carbide without the silicon layer 12. FIG. 4 also shows a breakdown of the on-resistance.

As shown in FIG. 4, the on-resistance of the MOSFET 100 of this embodiment is lower than that of the comparative example by about 17%. The breakdown indicates that the channel resistance and the JFET resistance are greatly reduced. In this embodiment, the JFET resistance is a resistance of the n⁻-type substrate region 32 at a portion between the first well region 34a and the second well region 34b in FIG. 1. The reduction of the channel resistance and the JFET resistance are both caused by the high mobility of the electrons in silicon.

A cause of an increase in the proportion of the drift resistance in the embodiment is that the current path is narrowed in the silicon carbide layer 10 by providing the first field-relaxation region 30a and the second field-relaxation region 30b.

The MOSFET 100 of this embodiment is obtained by independently manufacturing the silicon carbide layer 10 side and the silicon layer 12 side and then bonding the sides through the metal layer 14. Therefore, an optimum process can be selected for each of the silicon carbide layer 10 side and the silicon layer 12 side, and thus a low-cost and high-performance MOSFET 100 can be obtained.

For example, a solder that can be bonded at low temperatures is used as the metal layer 14, thereby suppressing fluctuation in electric characteristics of the source electrode 16, the drain electrode 18, and the like formed at low temperatures.

In addition, for example, direct bonding of the silicon carbide layer 10 with the silicon layer 12 may cause problems such as a crystal defect due to a mismatch between the crystal lattices of the layers, and degradation of current characteristics due to a mismatch between the band gaps of the layers. In the MOSFET 100 of this embodiment, the metal layer 14 is provided between the silicon carbide layer 10 and the silicon layer 12, thereby suppressing occurrence of such problems caused by a crystal lattice mismatch or a band gap mismatch.

It is preferable that the first field-relaxation region 30a and the second field-relaxation region 30b are electrically connected to the source electrode 16 and fixed to the source potential to increase the electric field relaxation effect. However, the first field-relaxation region 30a and the second field-relaxation region 30b can be fixed to a potential other than the source potential. It is also possible to set the first field-relaxation region 30a and the second field-relaxation region 30b to a floating state without fixing them to a specific potential. In the case where the first field-relaxation region 30a and the second field-relaxation region 30b are set in a floating state, the first field-relaxation region 30a and the second field-relaxation region 30b can be brought into contact with the metal layer 14, for example.

The distance d1 between the first field-relaxation region 30a and the second field-relaxation region 30b is preferably larger than the distance d2 between the first well region 34a and the second well region 34b. By enlarging the distance d1, constriction of the current flowing in the drift region 28 is suppressed, thereby suppressing an increase in the on-resistance.

The concentration of each of the p-type impurities in the first field-relaxation region 30a and the second field-relaxation region 30b is preferably $1 \times 10^{16}$ cm$^{-3}$ to $1 \times 10^{18}$ cm$^{-3}$. When the concentration falls below the above range, there is a possibility that a sufficient electric field relaxation effect cannot be obtained. When the concentration exceeds the above range, the electric field at the junction between the first field-relaxation region 30a and the second field-relaxation region 30b becomes too high, which may cause a reduction in the breakdown voltage of the MOSFET 100.

In the case of using solder for the metal layer 14, for example, a barrier region may be provided at least one of between the solder and the silicon layer 12 and between the solder and the silicon carbide layer 10 in the metal layer 14. The barrier region is, for example, a metal film containing at least one of titanium (Ti) and tungsten (W). For example, tungsten nitride or the like can be used. Providing such a barrier region suppresses diffusion of impurities from the solder into the silicon layer 12 and/or the silicon carbide layer 10. The impurities are, for example, tin (Sn), silver (Ag), and copper (Cu).

As described above, this embodiment provides the MOSFET 100 with a high breakdown voltage and low on-resistance.

Second Embodiment

A semiconductor device of this embodiment differs from that of the first embodiment in that the semiconductor device does not include the second semiconductor region of the second-conductivity type nor the third semiconductor region of the second-conductivity type. Descriptions for the matters overlapping with the first embodiment are omitted.

Figure 5:
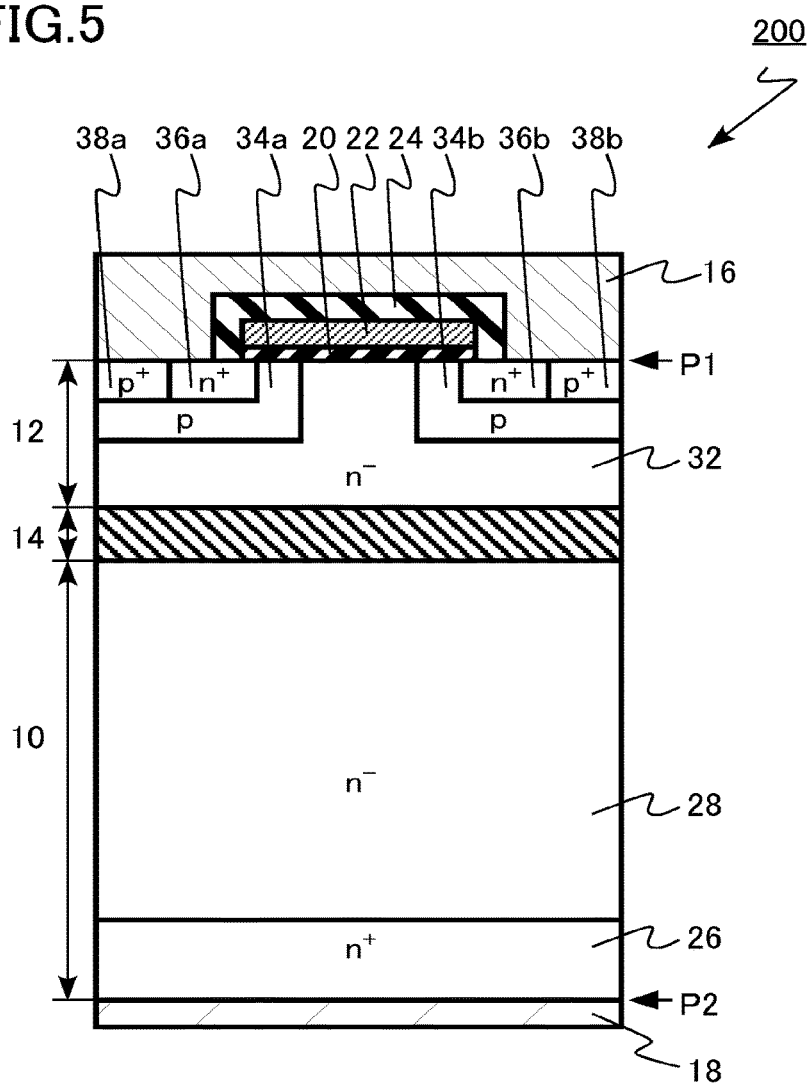
FIG. 5 is a schematic sectional view of a semiconductor device according to a second embodiment.

FIG. 5 is a schematic sectional view of the semiconductor device of this embodiment. In a MOSFET 200 of this embodiment, the silicon carbide layer 10 does not include a p-type first field-relaxation region 30a (second semiconductor region) nor a p-type second field-relaxation region 30b (third semiconductor region).

Since the MOSFET 200 of this embodiment does not include the first field-relaxation region 30a nor the second field-relaxation region 30b, there is a possibility that the breakdown voltage is lowered as compared with the MOSFET 100 of the first embodiment. However, the MOSFET 200 with a high breakdown voltage and low on-resistance is obtained by the same function as in the first embodiment.

Third Embodiment

A semiconductor device of this embodiment differs from that of the first embodiment in that the impurity concentration of the first-conductivity type in a first portion of a first silicon region between a second silicon region and a third silicon region is higher than the impurity concentration of the first-conductivity type in a second portion of the first silicon region between a metal layer and the second silicon region and higher than the impurity concentration of the first-conductivity type in the third portion of the first silicon region between the metal layer and the third silicon region. Descriptions for the matters overlapping with the first embodiment are omitted.

Figure 6:
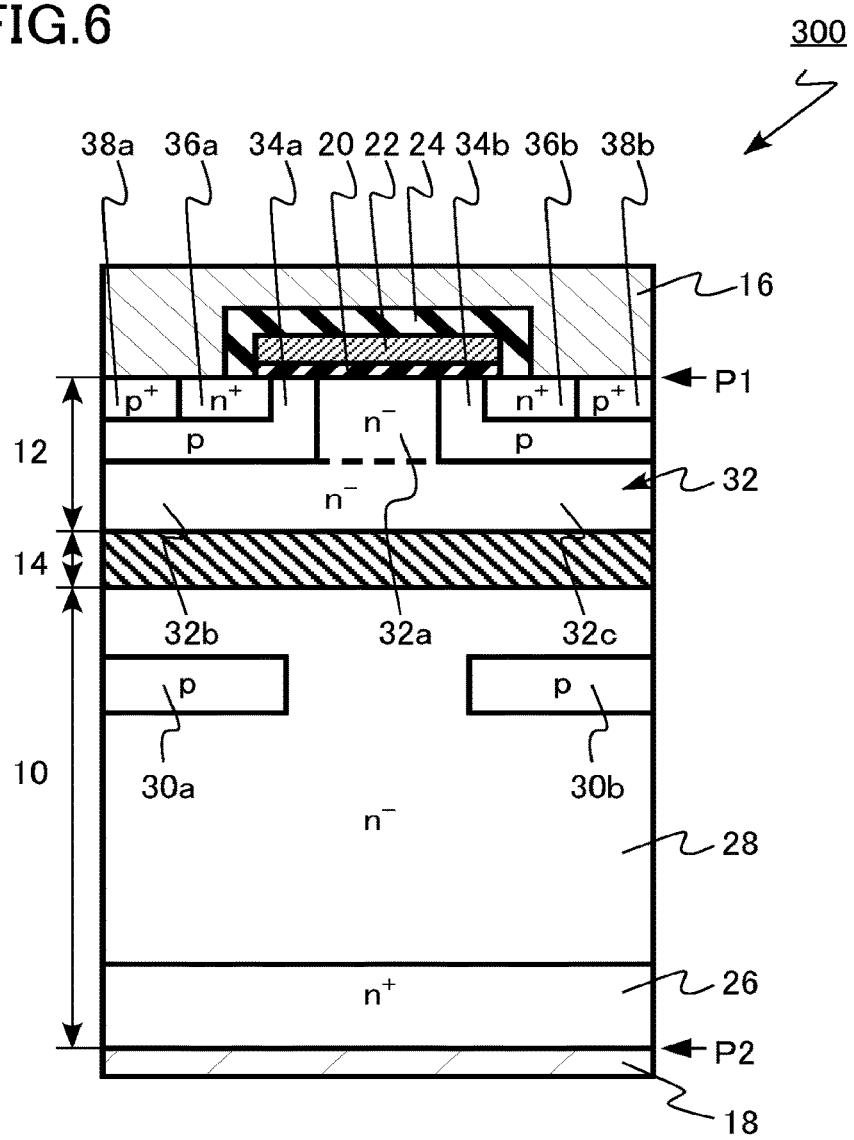
FIG. 6 is a schematic sectional view of a semiconductor device according to a third embodiment.

FIG. 6 is a schematic sectional view of the semiconductor device of this embodiment. In a MOSFET 300 of this embodiment, an n$^-$-type substrate region 32 (first silicon region) in a silicon layer 12 includes a first portion 32a, a second portion 32b, and a third portion 32c.

The first portion 32a is disposed between the p-type first well region 34a (second silicon region) and the p-type second well region 34b (third silicon region). The first portion 32a is a so-called JFET region. The current density in the JFET region increases when the MOSFET 300 is in an ON state.

The second portion 32b is disposed between the metal layer 14 and the p-type first well region 34a (second silicon region). The third portion 32c is disposed between the metal layer 14 and the p-type second well region 34b (third silicon region).

The concentration of the n-type impurities in the first portion 32a is higher than the concentration of the n-type impurities of the second portion 32b and the concentration of the n-type impurities in the third portion 32c. According to the MOSFET 300 of this embodiment, the resistance of the JFET region is lowered, and thus the on-resistance of the MOSFET 300 is reduced.

According to this embodiment, the MOSFET 300 with a high breakdown voltage and low on-resistance is obtained by the same function as in the first embodiment. As the resistance of the JFET region is lowered, the on-resistance is further reduced.

Fourth Embodiment

A semiconductor device of this embodiment differs from that of the first embodiment in that the semiconductor device further includes a fourth semiconductor region disposed in a semiconductor layer and between a metal layer and a first semiconductor region and having an impurity concentration of the first-conductivity type higher than that of the first semiconductor region, and also includes a sixth silicon region disposed in a silicon layer and between the metal layer and the first silicon region and having an impurity concentration of the first-conductivity type higher than that of the first silicon region. Descriptions for the matters overlapping with the first embodiment are omitted.

Figure 7:
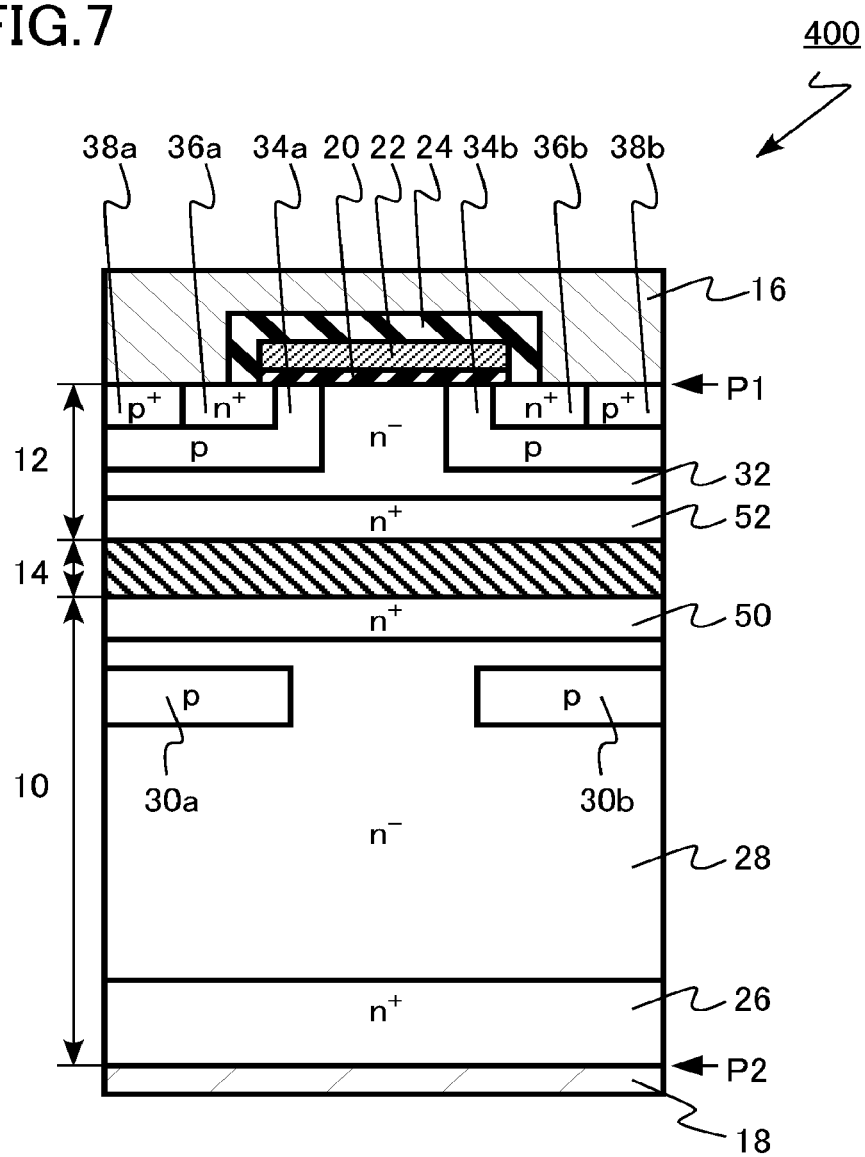
FIG. 7 is a schematic sectional view of a semiconductor device according to a fourth embodiment.

FIG. 7 is a schematic sectional view of the semiconductor device of this embodiment. A MOSFET 400 of this embodiment includes an n$^+$-type first n-type high-concentration region 50 (fourth semiconductor region) and an n$^+$-type second n-type high-concentration region 52 (sixth silicon region).

The n$^+$-type first n-type high-concentration region 50 is disposed in the silicon carbide layer 10. The concentration of the n-type impurities in the first n-type high-concentration region 50 is higher than the concentration of the n-type impurities in the n$^-$-type drift region 28 (first semiconductor region).

The first n-type high-concentration region 50 contains, for example, nitrogen (N) as n-type impurities. The concentration of the n-type impurities in the first n-type high-concentration region 50 is, for example, $1 \times 10^{19}$ cm$^{-3}$ or more and $1 \times 10^{21}$ cm$^{-3}$ or less.

The n$^+$-type second n-type high-concentration region 52 is disposed in the silicon layer 12. The concentration of the n-type impurities in the second n-type high-concentration region 52 is higher than the concentration of the n-type impurities in the n$^-$-type substrate region 32 (first silicon region).

The second n-type high-concentration region 52 contains, for example, phosphorus (P) or arsenic (As) as n-type impurities. The concentration of the n-type impurities in the second n-type high-concentration region 52 is, for example, $1 \times 10^{19}$ cm$^{-3}$ or more and $1 \times 10^{21}$ cm$^{-3}$ or less.

The MOSFET 400 of this embodiment includes the first n-type high-concentration region 50, whereby the contact resistance at the interface between the silicon carbide layer 10 and the metal layer 14 is reduced. When the MOSFET 400 is in an ON state, the current flows in a direction from the n-type silicon carbide layer 10 to the metal layer 14. Accordingly, it is effective to provide the first n-type high-concentration region 50 so that the carriers can easily tunnel a barrier.

In addition, the MOSFET 400 of this embodiment includes the second n-type high-concentration region 52, whereby the contact resistance at the interface between the silicon layer 12 and the metal layer 14 is reduced. When a return current flows through the MOSFET 400, the current flows in a direction from the n-type silicon layer 12 to the metal layer 14. Accordingly, it is effective to provide the second n-type high-concentration region 52 so that the carriers can easily tunnel a barrier.

In this embodiment, an example in which the MOSFET 400 includes both the first n-type high-concentration region 50 and the second n-type high-concentration region 52 is described, but the MOSFET 400 may include either one of the first n-type high-concentration region 50 and the second n-type high-concentration region 52.

According to this embodiment, the MOSFET 400 with a high breakdown voltage and low on-resistance is obtained by the same function as in the first embodiment. The contact resistance at the interface between the silicon carbide layer 10 and the metal layer 14 and the contact resistance at the interface between the silicon layer 12 and the metal layer 14 are reduced, and thus the on-resistance is further reduced.

Fifth Embodiment

A semiconductor device of this embodiment differs from that of the first embodiment in that the semiconductor device further includes a second gate electrode, a ninth silicon region of the second-conductivity type disposed in a silicon layer, a tenth silicon region and an eleventh silicon region of the first-conductivity type that are disposed in the silicon layer and are separated from each other, and a second gate insulating layer between the ninth silicon region, which is disposed between the tenth silicon region and the eleven silicon region, and the second gate electrode. Descriptions for the matters overlapping with the first embodiment are omitted.

Figure 8:
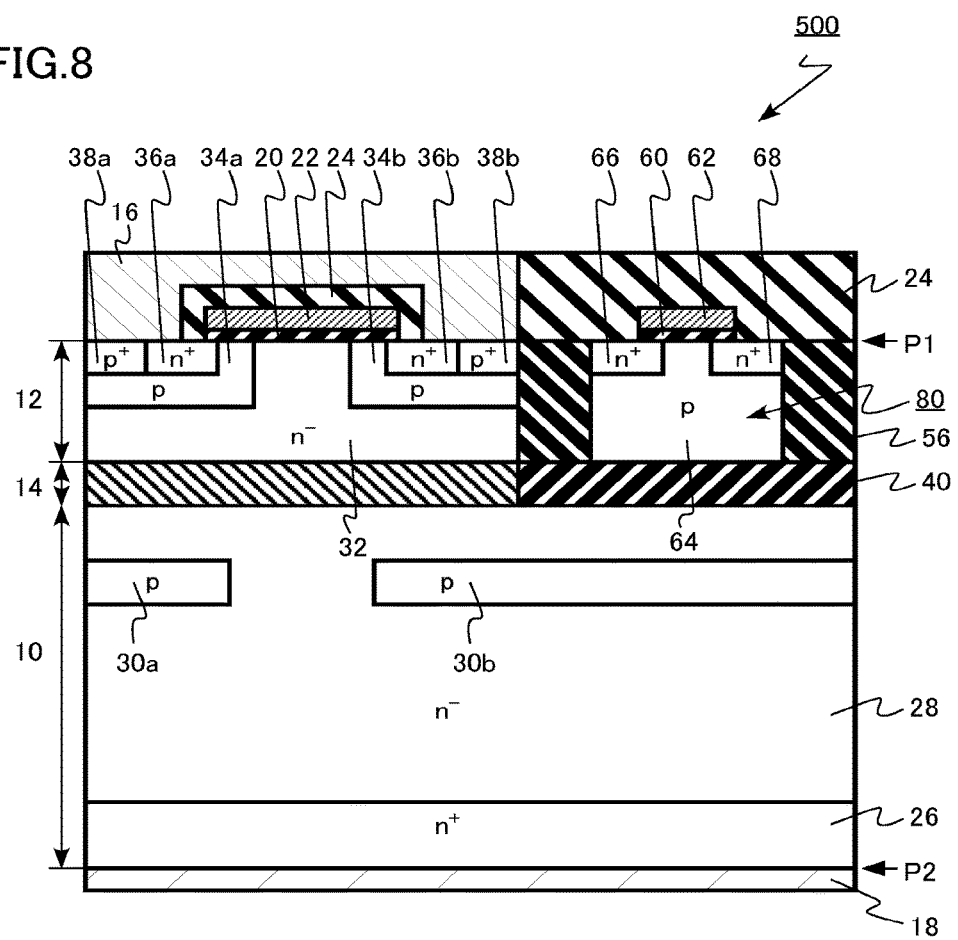
FIG. 8 is a schematic sectional view of a semiconductor device according to a fifth embodiment.

FIG. 8 is a schematic sectional view of the semiconductor device of this embodiment. A semiconductor device 500 of this embodiment includes a peripheral circuit region 80 (region), an insulating layer 40, an element isolation region 56 (insulating region), a second gate electrode 62, and a second gate insulating layer 60 in a vertical MOSFET.

The peripheral circuit region (region) 80 is disposed in the silicon layer 12. The peripheral circuit region (region) 80 is surrounded by the insulating layer 40 and the element isolation region 56. The peripheral circuit region (region) 80 is electrically separated from the silicon carbide layer 10 and the substrate region 32 by the insulating layer 40 and the element isolation region 56.

The insulating layer 40 is formed of, for example, silicon oxide. The element isolation region 56 is formed of, for example, silicon oxide.

In the peripheral circuit region 80 (region), a p-type substrate region 64 (ninth silicon region), an n$^+$-type source region 66 (tenth silicon region), and an n$^+$-type drain region 68 (eleventh silicon region) are provided. The source region 66 and the drain region 68 are separated from each other.

The source region 66 and the drain region 68 contain, for example, phosphorus (P) or arsenic (As) as n-type impurities. The concentration of the n-type impurities in the source region 66 and the drain region 68 is, for example, $1 \times 10^{19}$ cm$^{-3}$ or more and $1 \times 10^{21}$ cm$^{-3}$ or less.

The second gate insulating layer 60 is disposed between the substrate region 64, which is disposed between the source region 66 and the drain region 68, and the second gate electrode 62. The vicinity of the region where the substrate region 64 and the second gate insulating layer 60 are in contact with each other functions as a channel region of the MOSFET of the peripheral circuit region 80.

The second gate electrode 62 is a conductive layer. The second gate electrode 62 is formed of, for example, polycrystalline silicon containing p-type impurities or n-type impurities.

The second gate insulating layer 60 is formed of, for example, silicon oxide. For example, a high-k insulating material (high dielectric constant insulating material) is applicable to the second gate insulating layer 60.

The semiconductor device of this embodiment includes a lateral MOSFET in the peripheral circuit region 80. The lateral MOSFET may be an n-type MOSFET, a p-type MOSFET, or both.

In the peripheral circuit region 80, for example, a driver circuit and a protection circuit are formed using the lateral MOSFET. Note that, in the peripheral circuit region 80, elements other than the MOSFET such as a diode, a capacitor, and micro electro mechanical systems (MEMS) may be provided.

The semiconductor device 500 of this embodiment includes a peripheral circuit on the same chip as the vertical MOSFET, whereby, for example, the semiconductor device 500 with reduced parasitic inductance and with high performance is obtained. Since the semiconductor device 500 of this embodiment is manufactured by joining the silicon carbide layer 10 and the silicon layer 12, a peripheral circuit is easily provided on the same chip as the vertical MOSFET.

According to this embodiment, the semiconductor device 500 with a high breakdown voltage and low on-resistance is obtained by the same function as in the first embodiment. Furthermore, the peripheral circuit is provided on the same chip as the vertical MOSFET, whereby the high-performance semiconductor device 500 is obtained.

Sixth Embodiment

An inverter circuit and a drive device of this embodiment is a drive device including one of the semiconductor devices of the first to fifth embodiments.

Figure 9:
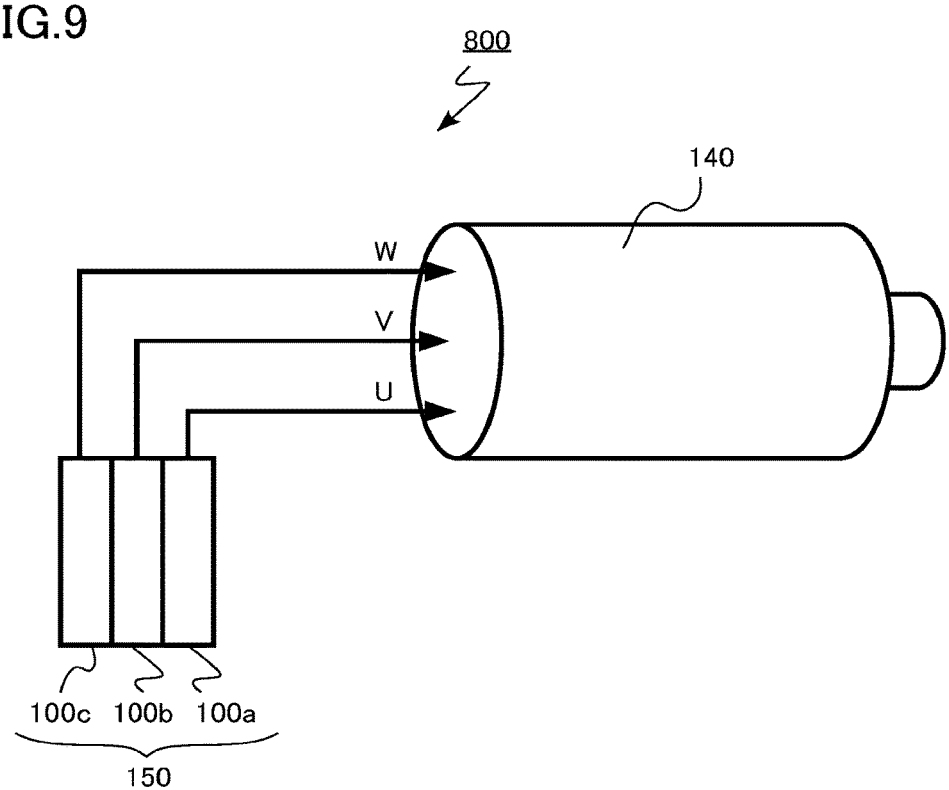
FIG. 9 is a schematic diagram of a drive device according to a sixth embodiment.

FIG. 9 is a schematic diagram of the drive device of this embodiment. A drive device 800 includes a motor 140 and an inverter circuit 150.

The inverter circuit 150 is formed of three semiconductor modules 100a, 100b, 100c each including one of the MOSFETs of the first to fifth embodiments as a switching element. The three semiconductor modules 100a, 100b, 100c are connected in parallel, whereby the three-phase inverter circuit 150 with three AC-voltage output terminals U, V, W is obtained. The AC voltage output from the inverter circuit 150 drives the motor 140.

According to this embodiment, the characteristics of the inverter circuit 150 and the drive device 800 are enhanced by providing the MOSFETs having improved characteristics.

Seventh Embodiment

A vehicle of this embodiment includes one of the semiconductor devices of the first to fifth embodiments.

Figure 10:
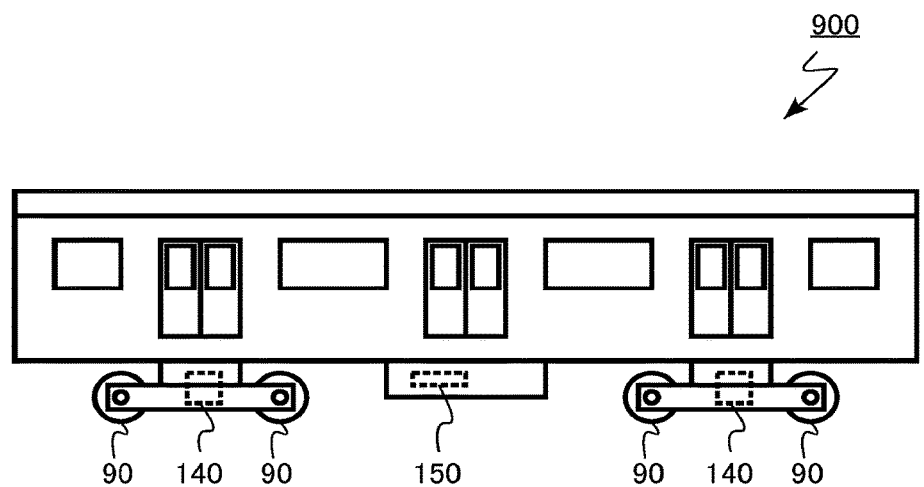
FIG. 10 is a schematic diagram of a vehicle according to a seventh embodiment.

FIG. 10 is a schematic diagram of a vehicle according to this embodiment. A vehicle 900 of this embodiment is a railway vehicle. The vehicle 900 includes motors 140 and an inverter circuit 150.

The inverter circuit 150 is formed of three semiconductor modules 100a, 100b, 100c each including one of the MOSFETs of the first to fifth embodiments as a switching element. The three semiconductor modules 100a, 100b, 100c are connected in parallel, whereby the three-phase inverter circuit 150 with three AC-voltage output terminals U, V, W is obtained.

The AC voltage output from the inverter circuit 150 drives the motors 140. The motors 140 rotate wheels 90 of the vehicle 900.

According to this embodiment, the characteristics of the vehicle 900 are enhanced by providing the MOSFETs having improved characteristics.

Eighth Embodiment

A vehicle of this embodiment includes one of the semiconductor devices of the first to fifth embodiments.

Figure 11:
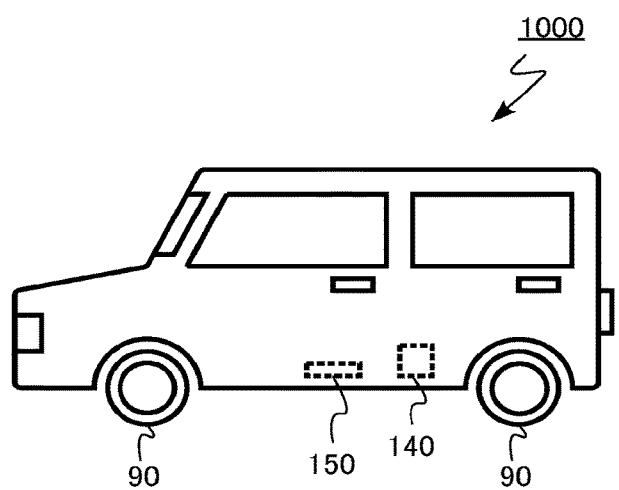
FIG. 11 is a schematic diagram of a vehicle according to an eighth embodiment.

FIG. 11 is a schematic diagram of a vehicle according to this embodiment. The vehicle 1000 according to this embodiment is an automobile. The vehicle 1000 includes a motor 140 and an inverter circuit 150.

The inverter circuit 150 is formed of three semiconductor modules 100a, 100b, 100c each including one of the MOSFETs of the first to fifth embodiments as a switching element. The three semiconductor modules 100a, 100b, 100c are connected in parallel, whereby the three-phase inverter circuit 150 with three AC-voltage output terminals U, V, W is obtained.

The AC voltage output from the inverter circuit 150 drives the motor 140. The motor 140 rotates the wheels 90 of the vehicle 1000.

According to this embodiment, the characteristics of the vehicle 1000 are enhanced by providing the MOSFETs having improved characteristics.

Ninth Embodiment

An elevating machine of this embodiment includes one of the semiconductor devices of the first to fifth embodiments.

Figure 12:
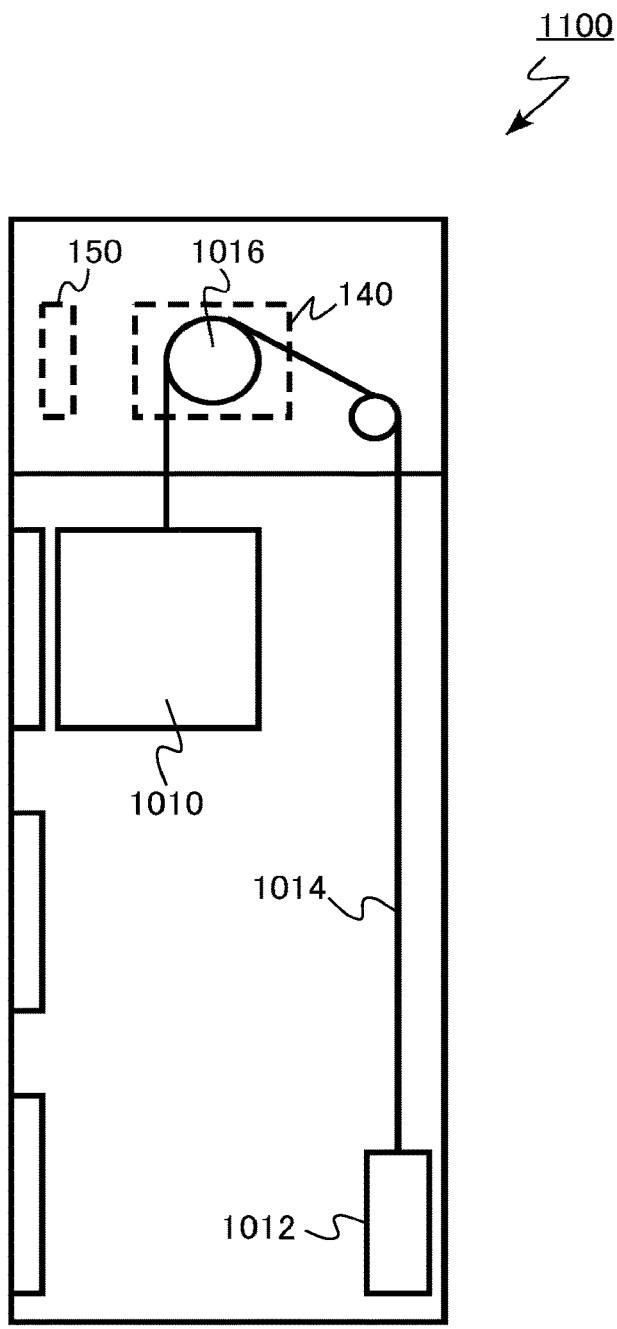
FIG. 12 is a schematic diagram of an elevating machine according to a ninth embodiment.

FIG. 12 is a schematic diagram of the elevating machine (elevator) of this embodiment. An elevating machine 1100 of this embodiment includes a car 1010, a counterweight 1012, a wire rope 1014, a hoisting machine 1016, a motor 140, and an inverter circuit 150.

The inverter circuit 150 is formed of three semiconductor modules 100a, 100b, 100c each including one of the MOSFETs of the first to fifth embodiments as a switching element. The three semiconductor modules 100a, 100b, 100c are connected in parallel, whereby the three-phase inverter circuit 150 with three AC-voltage output terminals U, V, W is obtained.

The AC voltage output from the inverter circuit 150 drives the motor 140. The hoisting machine 1016 is rotated by the motor 140, and the car 1010 moves up and down.

According to this embodiment, a MOSFET with improved characteristics is provided, thereby enhancing the characteristics of the elevating machine 1100.

While 4H-SiC has been used as an example to illustrate the crystal structure of SiC in the first to fifth embodiments, the present disclosure can be applied to devices using SiC of other crystal structures such as 6H-SiC, 3C-SiC.

In the first to fifth embodiments, the case where a silicon carbide layer is used as a semiconductor layer having a wider band gap than that of silicon has been exemplified. However, a nitride semiconductor layer or a diamond layer may be used as a semiconductor layer, for example.

In the first to fifth embodiments, a MOSFET has been used as an example to illustrate a semiconductor device, but the present disclosure can also be applied to IGBTs. In the case of the IGBT, it is only required that the conductivity type of the drain region 26 (fifth semiconductor region) of the first to fifth embodiments is changed from $n^+$-type to $p^+$-type.

In the first to fifth embodiments, the case where the first-conductivity type is an n-type and the second-conductivity type is a p-type has been described as an example, but the first-conductivity type may be a p-type and the second-conductivity type may be an n-type.

In the sixth to ninth embodiments, the cases where the semiconductor device of the present disclosure is applied to a vehicle, an elevator, and the like have been described as an example, but the semiconductor device of the present disclosure can also be applied to, for example, a power conditioner of a solar power generation system and the like.

While certain embodiments have been described, these embodiments have been presented by way of example only, and are not intended to limit the scope of the inventions. Indeed, semiconductor devices, inverter circuits, drive devices, vehicles, and elevating machines described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first electrode;
   a second electrode;
   a first gate electrode;
   a semiconductor layer disposed between the first electrode and the second electrode, a band gap of the semiconductor layer being wider than a band gap of silicon;
   a silicon layer disposed between the semiconductor layer and the first electrode;
   a metal layer disposed between the semiconductor layer and the silicon layer;
   a first semiconductor region of a first-conductivity type disposed in the semiconductor layer;
   a first silicon region of the first-conductivity type disposed in the silicon layer;
   a second silicon region of a second-conductivity type disposed in the silicon layer, the second silicon region disposed between the first silicon region and the first electrode;
   a third silicon region of the second-conductivity type disposed in the silicon layer, the third silicon region disposed between the first silicon region and the first electrode, the first silicon region being disposed between the second silicon region and the third silicon region;
   a first gate insulating layer disposed between the first gate electrode and the second silicon region, the first gate insulating layer disposed between the first gate electrode and the third silicon region;
a fourth silicon region of the first-conductivity type disposed in the silicon layer, the fourth silicon region disposed between the second silicon region and the first electrode; and
a fifth silicon region of the first-conductivity type disposed in the silicon layer, the fifth silicon region disposed between the third silicon region and the first electrode.

2. The semiconductor device according to claim 1, further comprising:
a second semiconductor region of the second-conductivity type disposed in the semiconductor layer, the second semiconductor region disposed between the second electrode and the second silicon region; and
a third semiconductor region of the second-conductivity type disposed in the semiconductor layer, the third semiconductor region disposed between the second electrode and the third silicon region, the first semiconductor region being disposed between the second semiconductor region and the third semiconductor region.

3. The semiconductor device according to claim 2, wherein the second semiconductor region and the third semiconductor region are electrically connected to the first electrode.

4. The semiconductor device according to claim 2, wherein the first semiconductor region is disposed between the second semiconductor region and the metal layer and the first semiconductor region is disposed between the third semiconductor region and the metal layer.

5. The semiconductor device according to claim 2, wherein the impurity concentration of the second-conductivity type of the second semiconductor region and the third semiconductor region is $1\times10^{16}$ cm$^{-3}$ or more and $1\times10^{18}$ cm$^{-3}$ or less.

6. The semiconductor device according to claim 2, wherein a distance between the second semiconductor region and the third semiconductor region is larger than a distance between the second silicon region and the third silicon region.

7. The semiconductor device according to claim 1, wherein the metal layer contains tin (Sn).

8. The semiconductor device according to claim 1, further comprising:
a fourth semiconductor region of the first-conductivity type disposed in the semiconductor layer, the fourth semiconductor region disposed between the metal layer and the first semiconductor region, an impurity concentration of the first-conductivity type being higher in the fourth semiconductor region than in the first semiconductor region.

9. The semiconductor device according to claim 1, further comprising:
a sixth silicon region of the first-conductivity type disposed in the silicon layer, the sixth silicon region disposed between the metal layer and the first silicon region, an impurity concentration of the first-conductivity type being higher in the sixth silicon region than in the first silicon region.

10. The semiconductor device according to claim 1, wherein an impurity concentration of the first-conductivity type in a first portion of the first silicon region between the second silicon region and the third silicon region is higher than an impurity concentration of the first-conductivity type in a second portion of the first silicon region between the metal layer and the second silicon region, and higher than an impurity concentration of the first-conductivity type in a third portion of the first silicon region between the metal layer and the third silicon region.

11. The semiconductor device according to claim 1, further comprising:
a fifth semiconductor region of the first-conductivity type disposed in the semiconductor layer, the fifth semiconductor region disposed between the second electrode and the first semiconductor region, and an impurity concentration of the first-conductivity type being higher in the fifth semiconductor region than in the first semiconductor region.

12. The semiconductor device according to claim 1, further comprising:
a seventh silicon region of the second-conductivity type disposed in the silicon layer, the seventh silicon region disposed between the second silicon region and the first electrode, an impurity concentration of the second-conductivity type being higher in the seventh silicon region than in the second silicon region; and
an eighth silicon region of the second-conductivity type disposed in the silicon layer, the eighth silicon region disposed between the third silicon region and the first electrode, an impurity concentration of the second-conductivity type being higher in the eighth silicon region than in the third silicon region.

13. The semiconductor device according to claim 1, further comprising:
a second gate electrode;
a ninth silicon region of the second-conductivity type disposed in the silicon layer;
a tenth silicon region of the first-conductivity type and an eleventh silicon region of the first-conductivity type that are separated from each other in the silicon layer; and
a second gate insulating layer disposed between the ninth silicon region and the second gate electrode, the ninth silicon region being disposed between the tenth silicon region and the eleventh silicon region.

14. The semiconductor device according to claim 1, further comprising an insulating layer disposed between the semiconductor layer and the silicon layer.

15. The semiconductor device according to claim 14, further comprising a region disposed in the silicon layer and surrounded by the insulating layer and an insulating region.

16. The semiconductor device according to claim 1, wherein the semiconductor layer is a silicon carbide layer.

17. An inverter circuit comprising the semiconductor device according to claim 1.

18. A drive device comprising the semiconductor device according to claim 1.

19. A vehicle comprising the semiconductor device according to claim 1.

20. An elevating machine comprising the semiconductor device according to claim 1.

* * * * *